United States Patent
Liu et al.

(10) Patent No.: US 10,046,548 B2
(45) Date of Patent: Aug. 14, 2018

(54) FLEXIBLE DEVICE AND FABRICATION METHOD THEREOF, DISPLAY APPARATUS

(71) Applicant: BOE TECHNOLOGY GROUP CO., LTD, Beijing (CN)

(72) Inventors: Lu Liu, Beijing (CN); Ming Che Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 95 days.

(21) Appl. No.: 15/031,242

(22) PCT Filed: Sep. 18, 2015

(86) PCT No.: PCT/CN2015/089924
§ 371 (c)(1),
(2) Date: Apr. 21, 2016

(87) PCT Pub. No.: WO2016/150120
PCT Pub. Date: Sep. 29, 2016

(65) Prior Publication Data
US 2017/0120569 A1    May 4, 2017

(30) Foreign Application Priority Data
Mar. 26, 2015 (CN) .......................... 2015 1 0138382

(51) Int. Cl.
*B32B 27/28* (2006.01)
*B32B 37/14* (2006.01)
(Continued)

(52) U.S. Cl.
CPC ............ *B32B 38/10* (2013.01); *B32B 27/281* (2013.01); *B32B 37/14* (2013.01); *H01L 51/003* (2013.01);
(Continued)

(58) Field of Classification Search
USPC ... 156/247, 272.2, 272.8, 307.1, 307.3, 701, 156/711, 712
See application file for complete search history.

(56) References Cited

U.S. PATENT DOCUMENTS

| | | | |
|---|---|---|---|
| 8,216,876 B2 * | 7/2012 | Yasumatsu | H01L 21/2007 438/99 |
| 8,222,062 B2 * | 7/2012 | Liao | H01L 27/1266 257/E21.134 |

(Continued)

FOREIGN PATENT DOCUMENTS

| CN | 103345084 A | 10/2013 |
|---|---|---|
| CN | 103413775 A | 11/2013 |

(Continued)

OTHER PUBLICATIONS

The World Intellectual Property Organization (WIPO) International Search Report and Written Opinion for PCT/CN2015/089924 dated Dec. 16, 2015 p. 1-12.

(Continued)

*Primary Examiner* — Sing P Chan
(74) *Attorney, Agent, or Firm* — Anova Law Group, PLLC

(57) ABSTRACT

A method for fabricating a flexible device is provided. The method includes forming a sacrificial layer on a substrate; and forming a reflective layer to reflect a laser for subsequently de-bonding the sacrificial layer from the rigid substrate back to the sacrificial layer to reduce required de-bonding energy of the laser over at least a portion of the rigid substrate. Further, the method includes forming a flexible device over the reflective layer; and separating the substrate from the sacrificial layer by irradiating the sacrificial layer using the laser.

9 Claims, 4 Drawing Sheets

(51) Int. Cl.
*B32B 38/10* (2006.01)
*H01L 27/32* (2006.01)
*H01L 51/00* (2006.01)

(52) U.S. Cl.
CPC ....... *B32B 2255/10* (2013.01); *B32B 2255/26* (2013.01); *B32B 2457/206* (2013.01); *H01L 27/3244* (2013.01); *H01L 2227/326* (2013.01); *H01L 2251/5338* (2013.01)

(56) References Cited

U.S. PATENT DOCUMENTS

| | | | |
|---|---|---|---|
| 9,623,633 B2 * | 4/2017 | Kim | ............ B32L 315/08 |
| 2005/0116235 A1 | 6/2005 | Schultz et al. | |
| 2015/0075706 A1 | 3/2015 | Cheng et al. | |
| 2016/0021732 A1 | 1/2016 | Zhou | |
| 2017/0120569 A1 | 5/2017 | Liu et al. | |

FOREIGN PATENT DOCUMENTS

| | | | |
|---|---|---|---|
| CN | 103762194 A | | 4/2014 |
| CN | 103996698 A | | 8/2014 |
| CN | 104051496 A | | 9/2014 |
| CN | 104143565 A | | 11/2014 |
| CN | 104716081 A | | 6/2015 |
| EP | 1640319 A2 | | 3/2006 |

OTHER PUBLICATIONS

State Intellectual Property Office of the P.R.C (SIPO) Office Action 1 for 2015101732980 dated Dec. 28, 2016 9 Pages.

* cited by examiner

FLEXIBLE DEVICE AND FABRICATION METHOD THEREOF, DISPLAY APPARATUS

CROSS-REFERENCES TO RELATED APPLICATIONS

This application is a national phase entry under 35 U.S.C. § 371 of International Application No. PCT/CN2015/089924, filed on Sep. 18, 2015, which claims priority to Chinese Patent Application No. 201510138382.9, filed on Mar. 26, 2015. The above enumerated patent applications are incorporated by reference herein in their entirety.

FIELD OF THE INVENTION

The present invention generally relates to the field of the display technologies and, more particularly, to a flexible device and fabrication processes thereof, and a display apparatus.

BACKGROUND

Currently, the manufacturing process for flexible electronic devices often includes a roll-to-roll process or a sheet-by-sheet process. The sheet-by-sheet process is able to better utilize the existing manufacturing processes and equipment for manufacturing LCD display panels. Specifically, the sheet-by-sheet process includes, sequentially, providing a rigid substrate as a carrier; forming a flexible device on the rigid substrate; and separating the formed flexible device from the rigid substrate.

One of the methods for separating the flexible device from the rigid substrate is a laser release method. The laser release method utilizes a laser to break down the interface between the flexible device and the rigid substrate to separate the rigid substrate from the flexible device. In the laser release method, a sacrificial layer is formed between the flexible device and the rigid substrate to facilitate the separation between the flexible device and the rigid substrate. Because the manufacturing of the flexible devices includes certain processes requiring high temperature, it requires the sacrificial layer to keep its original properties in a temperature range of approximately 300° C.~400° C.

Further, the sacrificial layer is often made of inorganic material, such as silicon nitride, or silicon oxide, etc. Therefore, it may need relatively high laser energy to separate the rigid substrate from the flexible devices; and the power consumption may be relatively high. The disclosed device structures, methods and systems at least partially solve one or more problems set forth above and other problems.

BRIEF SUMMARY OF THE DISCLOSURE

The present disclosure is at least able to reduce the laser energy during the de-bonding process for separating substrate from a flexible device and a.

One aspect of the present disclosure includes providing a method for fabricating a flexible apparatus. The method includes providing substrate; forming a sacrificial layer on the substrate; forming a reflective layer over at least a portion of sacrificial layer; forming a flexible device over the reflective layer; and separating the substrate from the flexible device by irradiating the sacrificial layer using laser, wherein the reflective layer is arranged to reflect laser back to the sacrificial layer, thereby reducing laser energy required for separating the substrate.

Optionally, the flexible device includes a flexible substrate and at least one display device formed on the flexible substrate.

Optionally, a position of the reflective layer is corresponding to a peripheral region of the flexible device.

Optionally, the sacrificial layer is made of organic material.

Optionally, the sacrificial layer is made of polyimide.

Optionally, forming the sacrificial layer further includes coating a polyimide solution on the substrate; and thermally curing the polyimide coating.

Optionally, the reflective layer covers the entire surface of the sacrificial layer.

Optionally, the flexible substrate is made of polyimide.

Optionally, the reflective layer is made of one of Al and AlNd.

Optionally, the reflective layer is formed by a plasma-enhanced sputtering process.

Another aspect of the present disclosure includes a flexible device; and the flexible device is formed by the disclosed method.

Another aspect of the present disclosure includes a display apparatus; and the display apparatus comprises a disclosed flexible device.

According to the disclosed embodiments, during the de-bonding process for separating a substrate from a flexible device and by a laser release method, because a reflective layer is formed on at least a portion of the sacrificial layer; and the reflective layer is able to reflect the irradiating laser back to the sacrificial layer, the energy of the laser absorbed by the sacrificial layer may be increased. Thus, the required laser energy for the de-bonding process may be reduced. Further, the laser may not need to be adjusted during the de-boning process. Thus, the production efficiency may be increased.

Other aspects of the present disclosure can be understood by those skilled in the art in light of the description, the claims, and the drawings of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

Figure 1:
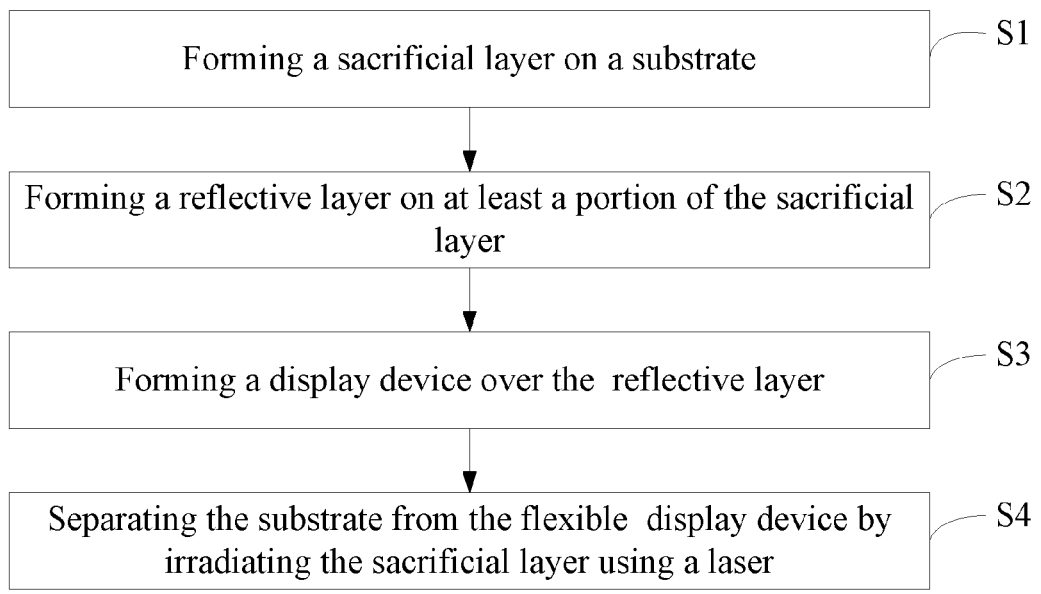
FIG. 1 illustrates an exemplary fabrication process of a flexible device according to the disclosed embodiments.

According to the disclosed embodiments, a method for fabricating a flexible device is provided. FIG. 1 illustrates an exemplary fabrication process of a flexible device according to the disclosed embodiments.

Figure 2:
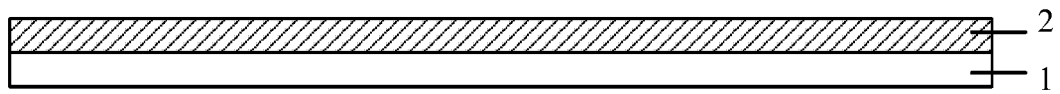
FIGS. 2~5 illustrate exemplary structures corresponding to certain stages of the exemplary fabrication process according to the disclosed embodiments.

As shown in FIG. 1, at the beginning of the fabrication process, a substrate is provided; and a sacrificial layer is formed on the substrate (S1). FIG. 2 illustrates a corresponding structure.

As shown in FIG. 2, a substrate 1 is provided, and a sacrificial layer 2 is formed on the substrate 1. The substrate 1 may be made of any appropriate material, such as silicon, quartz, rigid plastic, or glass, etc. In one embodiment, the substrate 1 is a rigid substrate made of glass. The substrate 1 provides a base for subsequent devices and processes. In one embodiment, the substrate 1 is a carrier substrate for forming a flexible device; and the substrate 1 may be separated from the flexible device after the flexible device is formed.

The sacrificial layer 2 may be used to separate the substrate 1 from the subsequently formed flexible device. During the process for separating substrate 1 from the subsequently formed flexible device, the sacrificial layer 2 may be broken chemically and or mechanically, and/or may be dissolved by a certain chemical and/or energy, etc. The sacrificial layer 2 may be made of any appropriate material, such as inorganic material including silicon oxide and silicon nitride, etc. The sacrificial layer 2 may also be made of a material which is able to be decomposed after absorbing the energy of a laser, such as organic material, etc.

In one embodiment, the sacrificial layer 2 is made of organic material. When organic material is used as the sacrificial layer 2, the sacrificial layer 2 may be easily decomposed by the energy of a laser. Thus, the laser energy for the de-bonding process, i.e., separating the substrate 1 from the subsequently formed flexible device, may be reduced. For example, polyimide (PI) material may be used as the sacrificial layer 2. Because PI material may endure a relatively high temperature, the sacrificial layer made of PI may be not be affected by the relatively high temperature used for subsequently forming a flexible device. Thus, the performance of the flexible device may not be affected.

Various processes may be used to form the sacrificial layer 2. In one embodiment, the sacrificial layer 2 is made of PI. Thus, a process for forming such a sacrificial layer 2 may include coating a PI solution on the substrate 1; and followed by a thermal curing process. Thus, the sacrificial layer 2 made of PI may be formed on the substrate 1. The thickness of the sacrificial layer 2 may be in a range of approximately 0.1 μm~5 μm.

Figure 3:
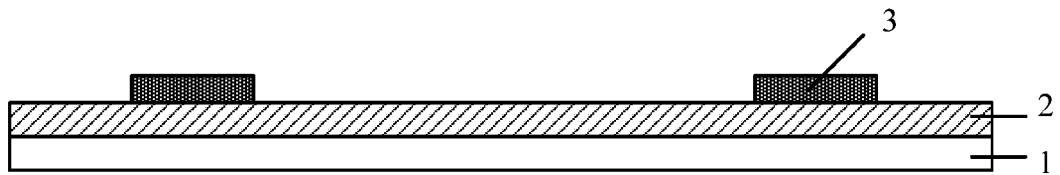

Returning to FIG. 1, after forming the sacrificial layer 2, a reflective layer 3 may be formed (S2). FIG. 3 illustrates a corresponding structure.

As shown in FIG. 3, a reflective layer 3 is formed on the sacrificial layer 2. The reflective layer 3 may cover a portion of the surface of the sacrificial layer 2. That is, the reflective layer 3 may be a patterned layer to expose a portion of the surface of the sacrificial layer 2. In one embodiment, the portion the surface of the sacrificial layer 2 having the reflective layer 3 may be corresponding to a peripheral region of the subsequently formed flexible device. The peripheral region may be a GOA design region, or an IC bonding region, etc.

During a practical situation, peripheral circuits in the peripheral region may be pressed on the substrate 1 using a relatively high temperature. Thus, in the peripheral region, the sacrificial layer 2 and the substrate 1 may have a higher adhesive force than other regions. Therefore, it may need higher energy to separate the substrate 1 from the subsequently formed flexible device. When the reflective layer 3 is only formed on the portion of the sacrificial layer 2 corresponding to the peripheral region of the subsequently formed flexible device, the reflective layer 3 may be able to reflect the laser for separating the substrate 1 from the subsequently formed flexible device back to the portion of the sacrificial layer 2 under the reflective layer 3. Thus, the required energy for separating the substrate 1 from the subsequently formed flexible device may be reduced.

Thus, during the de-bonding process for separating the substrate 1 and the subsequently formed flexible device, it may need only one laser energy, i.e., relatively low energy, to irradiate the peripheral region and other regions to separate the substrate 1 from the subsequently formed flexible device. Therefore, the laser energy for the de-bonding process may be reduced; and the step for adjusting the laser energy may be omitted; and the production efficiency may be improved.

The reflective layer 3 may be made of any appropriate material, such as Al, or AlNd, etc. Various processes may be used to form the sacrificial layer 3, such as a chemical vapor deposition (CVD) process, or a physical vapor deposition (PVD) process, etc. In one embodiment, the reflective layer 3 is formed by a plasma-enhanced sputtering process. The thickness of the reflective layer 3 may be in a range of approximately 5 nm~500 nm.

Figure 4:
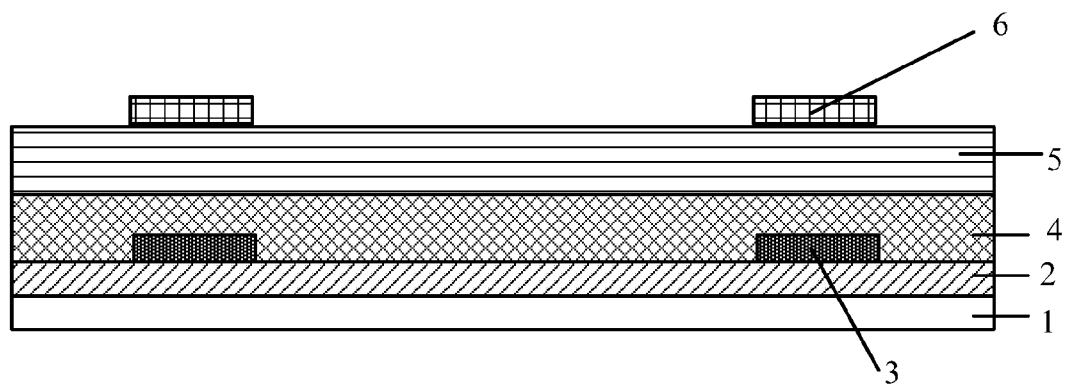

Returning to FIG. 1, after forming the reflective layer 3, a flexible device may be formed (S3). FIG. 4 illustrates a corresponding structure.

As shown in FIG. 4, a flexible device (not labeled) is formed over the reflective layer 3. In one embodiment, the flexible device may include a flexible substrate 4 formed over the reflective layer 3. Further, a display device 5 may be formed on the flexible substrate 4; and a peripheral circuit 6 may be formed over the display device 5. Certain devices may be omitted; and other devices may be added.

The flexible substrate 4 may be used for forming display devices and/or other devices and structures, etc., to form a flexible display device. The flexible substrate 4 may be made of any appropriate material. In one embodiment, PI material is used as the material of the flexible substrate 4. In one embodiment, as shown in FIG. 4, the flexible substrate 4 is formed on the reflective layer 3 and a portion of a sacrificial layer 2 not being covered by the reflective layer 3.

A process for forming the flexible substrate 4 made of PI may include coating a PI solution on the reflective layer 3 and the sacrificial layer 2; and followed by thermally curing the PI coating. Thus, the flexible substrate 4 may be formed.

Referring to FIG. 4, the flexible substrate 4, the display device 5 and the peripheral circuit 6 may form a flexible display device. The peripheral circuit 6 may be pressed on the display device 5. In certain other embodiments, the display device 5 may be more than one; and the peripheral circuit 6 may be more than one.

The display device 5 may include thin-film transistors, light-emitting diodes, and/or other appropriate devices and structures, etc. The peripheral circuit 6 may include the circuits to drive the display device, and/or other interconnect structures, etc.

Figure 5:
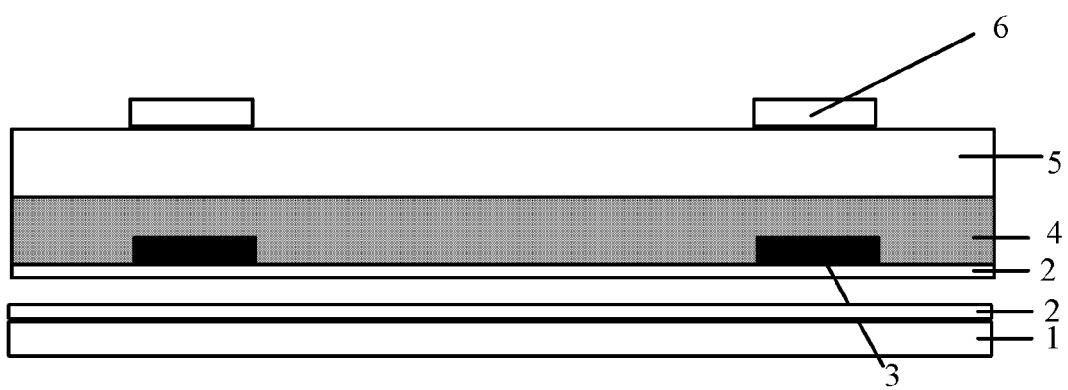

Returning to FIG. 1, after forming the flexible device, the substrate 1 may be separated from the flexible device (S4). FIG. 5 illustrates a corresponding structure.

As shown FIG. 5, the substrate 1 is separated from the flexible device and the flexible device may become a freestanding flexible device. In one embodiment, the substrate 1 is separated from the flexible device by a laser release method, which is also referred as a laser lift-off (LLO) method.

Specifically, a laser may irradiate the sacrificial layer 2 from the substrate 1 side. By irradiating the laser with an appropriate energy, the sacrificial layer 2 may be decomposed by the laser energy; and the substrate 1 may be separated from the sacrificial layer 2 without damaging the flexible device.

Referring to FIG. 5, after separating the substrate 1 from the flexible device, a portion of the sacrificial layer 2 may be left on the reflective layer 3 and the flexible substrate 4; and a portion of the sacrificial layer 2 may be left on the substrate 1.

According to disclosed embodiments, a reflective layer is formed on the patterned sacrificial layer, when the substrate is separated from the flexible device by a laser release method, the laser may be reflected back to the sacrificial layer. Thus, the energy absorbed by the sacrificial layer may be increased; and the energy for separating the substrate from the flexible device may be reduced.

Further, the adhesion force between the sacrificial layer and the substrate in the peripheral region of the flexible device may be greater than other regions. Thus, it may need higher laser energy in the peripheral region to separate the substrate from the flexible device. When the patterned reflective layer is formed on the region corresponding to the peripheral region, the laser energy in the sacrificial layer in the peripheral region may be greater than that of other regions because of the reflection. Thus, the laser energy may not need to be adjusted during the de-bonding process, the same laser energy may be used; and the production efficiency may be reduced.

Therefore, according the disclosed embodiments, a flexible device is provided; and FIG. 5 illustrates a corresponding flexible device. As shown in FIG. 5, the flexible device may include a sacrificial layer 2; and a reflective layer 3 formed on the sacrificial layer 2. The flexible device may also include a flexible substrate 4 formed on the reflective layer 3 and the sacrificial layer 2; and a display device 5 formed on the flexible substrate 4. Further, the flexible device may also include a peripheral circuit 6 on the display device 5. The flexible substrate 4 may be made of PI; and the reflective layer 3 may be made of metal. The position of the reflective layer 3 may be corresponding to the position of the peripheral circuit 6. The detailed structures and intermediate structures are described above with respect to the fabrication processes FIGS. 6~9 illustrate structures corresponding to certain stages of another fabrication process of a flexible device according to the disclosed embodiments.

Figure 6:
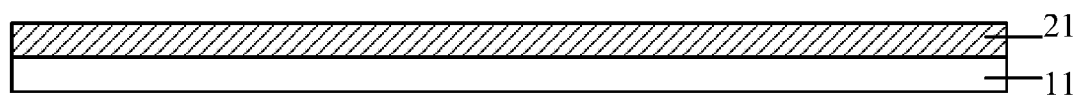
FIG. 6~9 illustrate exemplary structures corresponding to certain stages of another exemplary fabrication process according to the disclosed embodiments.

As shown in FIG. 6, at the beginning of the fabrication process, a substrate 11 is provided, and sacrificial layer 21 is formed on the substrate 11. The substrate 11 may be made of any appropriate material, such as silicon, quartz, rigid plastic, or glass, etc. In one embodiment, the substrate 11 is a rigid substrate made of glass. The substrate 11 provides a base for subsequent devices and processes. In one embodiment, the substrate 11 is a carrier substrate for forming a flexible device; and the substrate 11 may be separated from the flexible device after the flexible device is formed.

The sacrificial layer 21 may be used to separate the substrate 11 from the subsequently formed flexible device. During the process for separating substrate 11 from the subsequently formed flexible device, the sacrificial layer 21 may be broken chemically and or mechanically, and/or may be dissolved by a certain chemical and/or energy, etc. The sacrificial layer 21 may be made of any appropriate material, such as inorganic material including silicon oxide and silicon nitride, etc. The sacrificial layer 21 may also be made of a material which is able to be decomposed by absorbing the energy of a laser, such as organic material, etc.

In one embodiment, the sacrificial layer 21 is made of organic material. When organic material is used as the sacrificial layer 21, the sacrificial layer 21 may be easily decomposed by the energy of a laser. Thus, the laser energy for the de-bonding process, i.e., separating the substrate 21 from the subsequently formed flexible device, may be reduced. For example, polyimide (PI) material may be used as the sacrificial layer 21. Because PI material may endure a relatively high temperature, the sacrificial layer 21 made of PI may be not be affected by the relatively high temperature used for subsequently forming a flexible device. Thus, the performance of the flexible device may not be affected.

Various processes may be used to form the sacrificial layer 21. In one embodiment, the sacrificial layer 21 is made of PI, a process for forming such a sacrificial layer 21 may include coating a PI solution on the substrate 11; and followed by a thermal curing process. Thus, the sacrificial layer 21 made of PI may be formed on the substrate 11. The thickness of the sacrificial layer 21 may be in a range of approximately 0.1 μm~5 μm.

Figure 7:
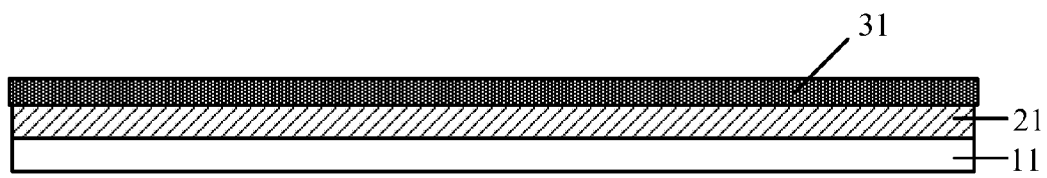

As shown in FIG. 7, after forming the sacrificial layer 21, a reflective layer 31 may be formed on the sacrificial layer 21. The reflective layer 31 may cover the entire surface of the sacrificial layer 21.

The reflective layer 31 may be made of any appropriate material, such as Al, or AlNd, etc. Various processes may be used to form the sacrificial layer 31, such as a CVD process, or a PVD process, etc. In one embodiment, the reflective layer 31 is formed by a plasma-enhanced sputtering process. The thickness of the reflective layer 31 may be in a range of approximately 5 nm~500 nm.

Figure 8:
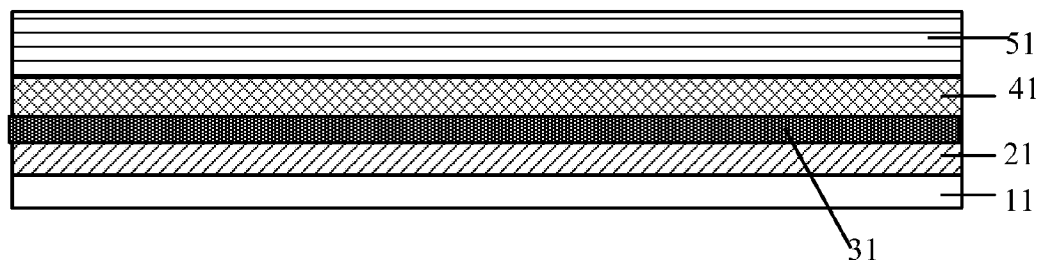

As shown in FIG. 8, after forming the reflective layer 31, a flexible device may be formed on the reflective layer 31. In one embodiment, the flexible device may include a flexible substrate 4 formed on the reflective layer 31. That is, the flexible substrate 41 may be formed on the entire surface of the reflective layer 31. Further, a display device 51 may be formed on the flexible substrate 41. Certain device may be omitted; and other devices may be added. For example, the flexible device may only include a flexible substrate.

The flexible substrate 41 may be used for forming display devices and/or other devices and structures, etc. to form a flexible display device. The flexible substrate 41 may be made of any appropriate material. In one embodiment, PI material is used as the material of the flexible substrate 41.

A process for forming the flexible substrate 41 made of PI may include coating a PI solution on the reflective layer 31; and followed by thermally curing the PI coating. Thus, the flexible substrate 41 may be formed.

Referring to FIG. 8, the flexible substrate 41 and the display device 51 may form the flexible display device. In certain other embodiments, the display device 51 may be more than one. The display device 51 may include thin-film transistors, light-emitting diodes, and/or other appropriate devices and structures.

Figure 9:
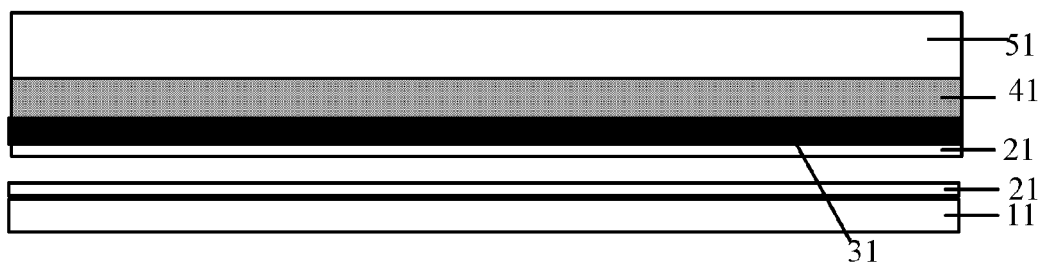

As shown in FIG. 9, after forming the flexible device, the substrate 11 may be separated from the flexible device; and the flexible device may become a free-standing flexible device. In one embodiment, the substrate 11 is separated from the flexible device by a laser release method, which is also referred as a laser lift-off (LLO) method.

Specifically, a laser may irradiate the sacrificial layer 21 from the substrate 11 side. By irradiating the laser with an appropriate energy, the sacrificial layer 21 may be decomposed by the laser energy and the substrate 11 may be separated from the sacrificial layer 21 without damaging the flexible device.

Referring to FIG. 9, after separating the substrate 11 from the flexible device, a portion of the sacrificial layer 21 may be left on the reflective layer 31; and a portion of the sacrificial layer 2 may be left on the substrate 11.

Optionally and additionally, after removing the portion of the sacrificial layer 21, the reflective layer 31 may be removed. The reflective layer 31 may be removed by any appropriate process, such as a dry etching process or a wet etching process, etc.

According to disclosed embodiments, a reflective layer is formed on the entire surface of the sacrificial layer, when the substrate is separated from the flexible device by a laser release method, the laser may be reflected back to the sacrificial layer. Thus, the energy absorbed by the sacrificial layer may be increased; and the energy for separating the substrate may be reduced.

Figure 10:
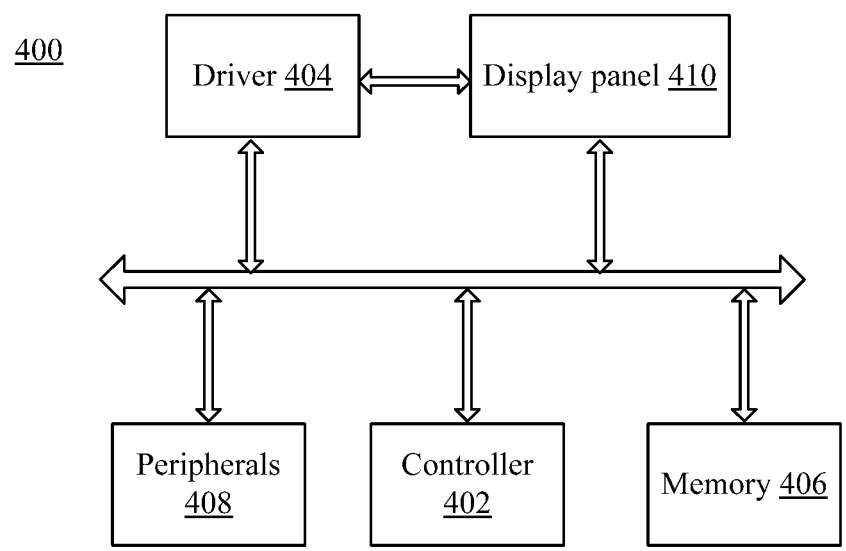
FIG. 10 illustrates a block diagram of an exemplary display apparatus according to the disclosed embodiments.

Correspondingly, the present disclosure also provides a display apparatus. FIG. 10 illustrates an exemplary display apparatus 400 incorporating the disclosed flexible devices and other aspects of the present disclosure. The display apparatus 400 may be any appropriate device or component with certain display function, such as OLED display, flexible display, or e-paper, etc. As shown in FIG. 10, the display apparatus 400 includes a controller 402, a driver circuit 404, a memory 406, peripherals 408, and a display panel 410. Certain devices may be omitted and other devices may be included.

The controller 402 may include any appropriate processor or processors.

Further, the controller 402 can include multiple cores for multi-thread or parallel processing. The memory 406 may include any appropriate memory modules. The memory 406 may store computer programs for implementing various processes, when executed by the controller 402.

Peripherals 408 may include any interface devices for providing various signal interfaces, Peripherals 408 may also include any appropriate communication module for establishing connections through wired or wireless communication networks.

The driver circuitry 404 may include any appropriate driving circuits to drive the display panel 410. The display panel 410 may include any appropriate flat panel display comprising the disclosed flexible device. In certain embodiments, the display panel 410 may include an AMOLED panel. During operation, the display 410 may be provided with image signals by the controller 402 and the driver circuit 404 for display. Because the display apparatus includes the disclosed display device, the production efficiency may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a flexible device, comprising:
providing a substrate;
forming a sacrificial layer on the substrate;
forming a patterned reflective layer over the sacrificial layer to cover at least a portion of the sacrificial layer and expose at least another portion of the sacrificial layer;
forming a flexible substrate over the sacrificial layer and the patterned reflective layer;
forming a flexible device over the flexible substrate; and
separating the substrate from the flexible device by irradiating the sacrificial layer using laser, wherein the patterned reflective layer is arranged to reflect laser back to the sacrificial layer, thereby reducing laser energy required for separating the substrate.

2. The method according to claim 1, wherein:
the flexible device includes at least one display device formed on the flexible substrate.

3. The method according to claim 2, wherein:
a position of the patterned reflective layer is corresponding to a peripheral region of the flexible device.

4. The method according to claim 2, wherein:
the flexible substrate is made of polyimide.

5. The method according to claim 1, wherein:
the sacrificial layer is made of organic material.

6. The method according to claim 5, wherein:
the sacrificial layer is made of polyimide.

7. The method according to claim 5, wherein forming the sacrificial layer further includes:
coating a polyimide solution on the substrate; and
thermally curing the polyimide coating.

8. The method according to claim 1, wherein:
the patterned reflective layer is made of at least one of Al or AlNd.

9. The method according to claim 1, wherein:
the patterned reflective layer is formed by a plasma-enhanced sputtering process.

* * * * *